(12) United States Patent
Na

(10) Patent No.: US 11,355,215 B2
(45) Date of Patent: Jun. 7, 2022

(54) DATA STORAGE APPARATUS AND OPERATION METHOD THEREOF

(71) Applicant: SK hynix Inc., Icheon-si (KR)

(72) Inventor: Chung Un Na, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/149,578

(22) Filed: Jan. 14, 2021

(65) Prior Publication Data

US 2022/0013190 A1    Jan. 13, 2022

(30) Foreign Application Priority Data

Jul. 10, 2020 (KR) .................. 10-2020-0085085

(51) Int. Cl.
| G11C 16/04 | (2006.01) |
| G11C 29/42 | (2006.01) |
| G11C 29/52 | (2006.01) |
| G11C 29/44 | (2006.01) |

(52) U.S. Cl.
CPC ............ *G11C 29/42* (2013.01); *G11C 29/44* (2013.01); *G11C 29/52* (2013.01)

(58) Field of Classification Search
CPC .......... G11C 29/42; G11C 29/44; G11C 29/52
See application file for complete search history.

(56) References Cited

U.S. PATENT DOCUMENTS

| 9,042,160 | B1 * | 5/2015 | Gorobets ........... G11C 13/0002 365/189.05 |
| 2020/0020398 | A1 * | 1/2020 | Miller ................... G06F 3/0653 |
| 2020/0081656 | A1 * | 3/2020 | Park ....................... G06F 3/0673 |

FOREIGN PATENT DOCUMENTS

| KR |   101307953 B | 9/2013 |
| KR | 1020170036074 A | 3/2017 |
| KR | 1020170130380 A | 11/2017 |
| KR | 1020180011376 A | 2/2018 |

\* cited by examiner

*Primary Examiner* — Pho M Luu
(74) *Attorney, Agent, or Firm* — Perkins Coie LLP

(57) ABSTRACT

A data storage apparatus may include a data storage device including at least one data die to store first data, and at least one parity die to store second data, third data, and a chip-kill parity, where the at least one data die and the at least one parity die are connected to a channel, and controller in communication with the data storage device and configured to receive a write request for the first data and the second data from a host that is in communication with the data storage device through the channel to generate the chip-kill parity from the first data and the second data. The controller is further configured to read the third data from the parity die and provide the third data to the host upon receipt of a read request for the third data from the host while the chip-kill parity is being updated based on the first data.

18 Claims, 7 Drawing Sheets

DATA STORAGE APPARATUS AND OPERATION METHOD THEREOF

CROSS-REFERENCES TO RELATED APPLICATION

This patent document claims the priority and benefits of Korean application number 10-2020-0085085, filed on Jul. 10, 2020, which is incorporated herein by reference in its entirety.

TECHNICAL FIELD

The technology and implementations disclosed in this patent document generally relate to a semiconductor integrated apparatus, and more particularly, to a data storage apparatus and an operation method thereof.

BACKGROUND

A data storage apparatus refers to a device or apparatus that is in communication with a host to store and retrieve data at a request of the host. The data storage apparatus may include a data storage medium that can hold data temporarily or permanently.

One example of the data storage apparatus is the traditional hard disk drive (HDD) containing rotating magnetic disks. Data storage apparatuses using semiconductor memory devices as data storage media are advantageous over the traditional hard disk drives in terms of stability and durability since the semiconductor memory devices have no moving parts that are subject to mechanical failure and high power consumption.

As an example, the data storage apparatus using nonvolatile memory devices such as flash memory devices as data storage media can provide a low-cost, large-capacity, low-power-consumption, high-performance data storage solutions.

Such a data storage apparatus using nonvolatile memory devices is often called a solid state drive (SSD) and is replacing hard disk drives in various electronic devices.

SUMMARY

The technology disclosed in this patent document can be implemented in various embodiments to provide a data storage apparatus that can perform error detection and correction operations.

In an embodiment, a data storage apparatus may include: a data storage device including at least one data die to store first data, and at least one parity die to store second data, third data, and a chip-kill parity, where the at least one data die and the at least one parity die are connected to a channel, and controller in communication with the data storage device and configured to receive a write request for the first data and the second data from a host that is in communication with the data storage device through the channel to generate the chip-kill parity from the first data and the second data. The controller is further configured to read the third data from the parity die and provide the third data to the host upon receipt of a read request for the third data from the host while the chip-kill parity is being updated based on the first data.

In an embodiment, a data storage apparatus may include: a data storage device including at least one data die and at least one parity die, the at least one data die storing first data including a plurality of planes, the at least one parity die storing second data, third data, and a chip-kill parity and including a plurality of planes, the at least one data die and the at least one parity die being connected to a channel; and a controller in communication with the data storage device and configured to receive a write request for the first data and the second data from a host that is in communication with data storage device through the channel to generate the chip-kill parity from the first data and the second data. The controller is further configured to maintain the second data outside the data storage device until an update of the chip-kill parity based on the first data is completed.

In an embodiment, an operation method of a data storage apparatus, which includes a data storage device including at least one data die and at least one parity die and a controller that exchanges data with the data storage device, the at least one data die storing first data and including a plurality of planes, the at least one parity die storing second data, third data, and a chip-kill parity and including a plurality of planes, the at least one data die and the at least one parity die being connected to a channel, the operation method comprising: updating the chip-kill parity based on the first data upon receipt of a write request for the first data and the second data from a host through the channel; receiving a read request from the host while the chip-kill parity is being updated; and reading the third data from the parity die to provide the third data to the host in case that the read request is a read request for the third data.

In an embodiment, a data storage apparatus may include: a storage including at least one data memory circuit that stores first data and is composed of a plurality of planes and at least one parity memory circuit that stores second data, third data, and a chip-kill parity and is composed of a plurality of planes, the at least one data memory circuit and the at least one parity memory circuit being connected to substantially the same channel; and a controller configured to receive a write request for the first data and the second data from a host connected to the data storage device through the channel, to generate the chip-kill parity from the first data and the second data, and to read the third data from the parity memory circuit and provide the third data to the host when a read request for the third data is received from the host while the chip-kill parity is being updated based on the first data.

In an embodiment, a data storage apparatus may include: a storage including at least one data memory circuit that stores first data and is composed of a plurality of planes and at least one parity memory circuit that stores second data, third data, and a chip-kill parity and is composed of a plurality of planes, the at least one data memory circuit and the at least one parity memory circuit being connected to substantially the same channel; and a controller configured to receive a write request for the first data and the second data from a host through the channel, to generate the chip-kill parity from the first data and the second data, and to substantially maintain the second data outside the data storage device until update of the chip-kill parity based on the first data is completed.

In an embodiment, an operation method of a data storage apparatus, which includes a storage including at least one data memory circuit and at least one parity memory circuit and a controller that exchanges data with the data storage device, the at least one data memory circuit storing first data and being composed of a plurality of planes, the at least one parity memory circuit storing second data, third data, and a chip-kill parity and being composed of a plurality of planes, the at least one data memory circuit and the at least one parity memory circuit being connected to substantially the same channel, may include: a step in which the controller updates the chip-kill parity on the basis of the first data as a write request for the first data and the second data is received from a host through the channel; a step in which a read request is received from the host while the chip-kill parity is being updated; and a step in which, when the read request is a read request for the third data, the controller reads the third data from the parity memory circuit and provides the third data to the host.

In an embodiment, a data storage apparatus may include a data storage device including at least one data memory circuit to store first data, and at least one parity memory circuit to store second data, third data, and a chip-kill parity, where the at least one data memory circuit and the at least one parity memory circuit are connected to a channel, and a controller in communication with the data storage device and configured to receive a write request for the first data and the second data from a host that is in communication with the data storage device through the channel to generate the chip-kill parity from the first data and the second data, wherein the controller is further configured to read the third data from the parity memory circuit and provide the third data to the host upon receipt of a read request for the third data from the host while the chip-kill parity is being updated based on the first data.

In an embodiment, a data storage apparatus may include a data storage device including at least one data memory circuit and at least one parity memory circuit, the at least one data memory circuit storing first data including a plurality of planes, the at least one parity memory circuit storing second data, third data, and a chip-kill parity and including a plurality of planes, the at least one data memory circuit and the at least one parity memory circuit being connected to a channel, and a controller in communication with the data storage device and configured to receive a write request for the first data and the second data from a host that is in communication with data storage device through the channel to generate the chip-kill parity from the first data and the second data, wherein the controller is further configured to maintain the second data outside the data storage device until an update of the chip-kill parity based on the first data is completed.

In an embodiment, an operation method of a data storage apparatus including a data storage device including at least one data memory circuit and at least one parity memory circuit and a controller that exchanges data with the data storage device, the at least one data memory circuit storing first data and including a plurality of planes, the at least one parity memory circuit storing second data, third data, and a chip-kill parity and including a plurality of planes, the at least one data memory circuit and the at least one parity memory circuit being connected to a channel is disclosed. The operation method may include updating the chip-kill parity based on the first data upon receipt of a write request for the first data and the second data from a host through the channel, receiving a read request from the host while the chip-kill parity is being updated, and reading the third data from the parity memory circuit to provide the third data to the host in case that the read request is a read request for the third data.

DETAILED DESCRIPTION

Hereinafter, embodiments of the present technology will be described in more detail with reference to the accompanying drawings.

Figure 1:
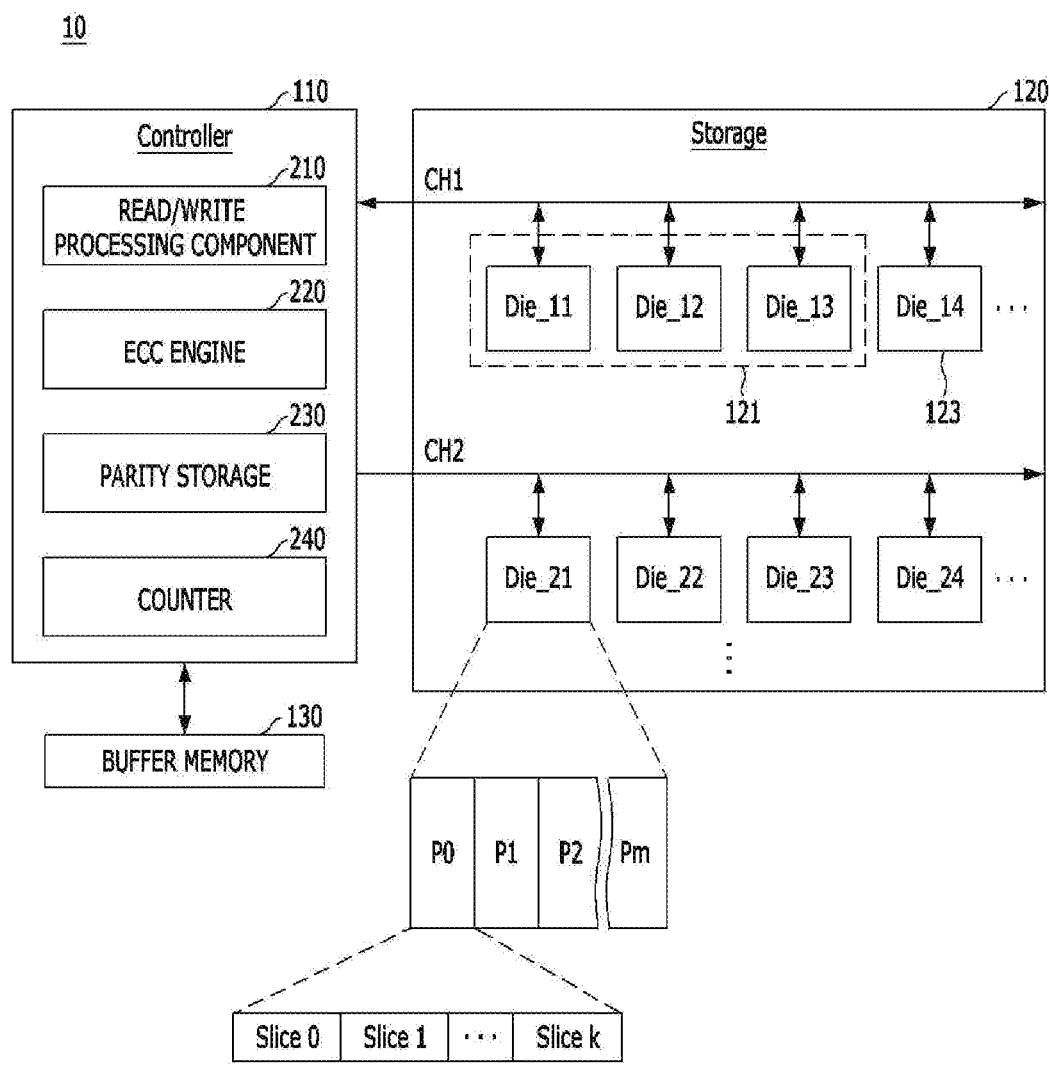
FIG. 1 is a configuration diagram of a data storage apparatus based on some embodiments of the disclosed technology.

FIG. 1 is a configuration diagram of a data storage apparatus 10 based on some embodiments of the disclosed technology.

Referring to FIG. 1, the data storage apparatus 10 based on some embodiments of the disclosed technology may include a controller 110, a storage 120, and a buffer memory 130.

The controller 110 may control the data storage device 120 in response to a request of a host. For example, the controller 110 may allow data to be written to the data storage device 120 at a write request of the host. Furthermore, the controller 110 may provide the data written in the data storage device 120 to the host in response to a read request of the host.

In an embodiment, the controller 110 may include a read/write processing circuit 210, an error check and correction (ECC) engine 220, a parity storage 230, and a counter 240, and a detailed configuration example of the controller 110 will be described with reference to FIG. 2.

The data storage device 120 may write or output the data in response to commands and/or control signals of the controller 110. The data storage device 120 may include a volatile and/or nonvolatile memory apparatus. In an embodiment, the data storage device 120 may be implemented using a memory element selected from various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM). The data storage device 120 may include a plurality of dies, or a plurality of chips, or a plurality of packages. The basic storage unit in the data storage device 120 for storing data is a memory cell that may operate as a single-level cell that stores one-bit data in one memory cell or a multi-level cell that stores multi-bit data in one memory cell.

In an embodiment, the controller 110 may be connected to a plurality of dies 11-14 and dies 21-24. In the example in FIG. 1, two communication channels, Ch1 and Ch2, are used to connect those dies: the channel CH1 for connecting, dies 11 to 14 and the channel CH2 for connecting dies 21 to 24. The number of the channels or the number of the dies connected to each channel is not limited to the present embodiment.

In an embodiment, a first die group D10 including the plurality of dies Die 11 to Die14 . . . may be connected to the first channel CH1 and may communicate with the controller 110 through the first channel CH1. A second die group D20 including the plurality of die Die 21 to Die 24, . . . may be connected to the second channel CH2 and may communicate with the controller 110 through the second channel CH2.

The die groups D10 and D20 connected to the respective channels CH1 and CH2 may include a plurality of data dies 121 (of D10) in which user data are stored and at least one parity die 123 (of D10) in which user data and a chip-kill parity are stored. In some implementations, the chip-kill parity may be used to restore data of a failed die within a data storage device or a memory module by storing ECC information on one or more extra chips or dies within the data storage device or memory module, and a memory controller or an ECC circuit may perform error detection and correction operations using ECC information on one or more extra chips or dies.

Although not illustrated in the drawing, each of the plurality of dies Die 11 to Die 14, Die 21 to Die 24, . . . may include a memory cell array and a page buffer.

In the dies Die 11 to Die 14, Die 21 to Die 24, each die may be divided into a plurality of planes P0 to Pm, and the page buffer may be provided corresponding to each of the plurality of planes P0 to Pm. Each plane of the data die 121 may be a data plane. Some of the plurality of planes included in the parity die 123 may be a data plane and another part thereof may be a parity plane. In some implementations, the planes can execute memory operations in parallel, and planes within a die can share control buses.

In an embodiment, each of the planes P0 to Pm may be divided into a plurality of slices Slice 0 to Slice k, and user data may be written or read in units of slices Slice 0 to Slice k. The slices Slice 0 to Slice k may be a unit for processing data of the ECC engine 220.

The buffer memory 130 serves as a space capable of temporarily storing data when the data storage apparatus 10 performs a series of operations, such as writing or reading data, in cooperation with the host. Although FIG. 1 illustrates an example in which the buffer memory 130 is located outside the controller 110, it is of course that the buffer memory 130 may be provided inside the controller 110.

In this patent document, user data written to the data die 121 is referred to as first data, user data written to the data plane of the parity die 123 is referred to as second data, and user data read from the data plane of the parity die 123 is referred to as third data. Each of the first to third data may be written or read in units of slices. That is, each of the first to third data may include a plurality of data slices.

The ECC engine 220 may generate an ECC parity from user data and store the ECC parity in the data storage device 120 together with the user data when writing the user data to the data storage device 120 at a request of the host. Furthermore, the ECC engine 220 may read the user data and the ECC parity from the data storage device 120 in response to a read request of the host and check and correct an error.

The chip-kill algorithm may perform an update operation (for example, XOR operation) on a chip-kill parity in units of slices with respect to write-requested user data and storing a final chip-kill parity in the parity die 123, and detecting and correcting an error by using the chip-kill parity when an error uncorrectable by an ECC code occurs in a specific data die or data plane during a user data read operation.

The chip-kill parity temporarily stored in the parity storage 230 may be updated on a data slice basis. In a case where the write-requested user data includes the first data and the second data, when the first data is stored in each data plane of the data die 121 and the second data is stored in each data plane of the parity die 123, final chip-kill data may be stored in the parity plane of the parity die 123.

In an implementation, the controller 110 may update the chip-kill parity stored in the first data on a data slice basis and update the chip-kill parity stored in the second data on a data slice basis, thereby generating the final chip-kill parity. When a read request for the third data is received from the host while the chip-kill parity based on the first data is being updated, the controller 110 may read the third data from the parity die 123 and provide the third data to the host.

In another implementation, the controller 110 may be configured not to transmit the second data to the parity die 123 while the update of the chip-kill parity based on the first data is being completed, but to substantially maintain the second data outside the data storage device 120, for example, in the controller 110 or the buffer memory 130. In such a case, since the parity die 123 has not been used or accessed by the controller 110, the controller 110 may immediately respond to the read request of the host when the host requests the third data to be read.

Figure 2:
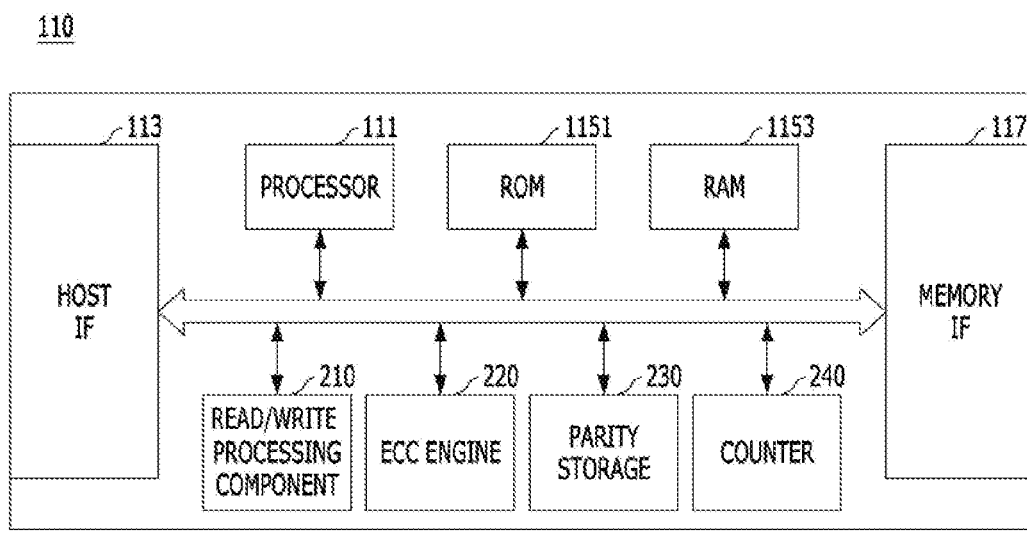
FIG. 2 is a configuration diagram of a controller based on some embodiments of the disclosed technology.

FIG. 2 is a configuration diagram of the controller 110 based on some embodiments of the disclosed technology.

Referring to FIG. 2, the controller 110 based on some embodiments of the disclosed technology may include a processor 111, a host interface (IF) 113, a ROM 1151, a RAM 1153, a memory interface (IF) 117, the read/write processing circuit 210, the ECC engine 220, the parity storage 230, and the counter 240.

The processor 111 may be configured to transfer various types of control information required for a data read or write operation for the data storage device 120 to the host IF 113, the RAM 1153, the memory IF 117, the read/write processing circuit 210, the ECC engine 220, the parity storage 230, and the counter 240. In an embodiment, the processor 111 may operate according to firmware provided for various operations of the data storage apparatus 10. In an embodiment, the processor 111 may perform a function of a flash translation layer (FTL) for managing the data storage device 120, for example, garbage collection, address mapping, wear leveling and the like. The processor 111 may be a combined type of hardware and software operating on the hardware.

The host IF 113 may provide a communication channel for receiving a command and a clock signal from the host and controlling data input/output under the control of the processor 111. Particularly, the host IF 113 may provide a physical connection between the host and the data storage apparatus 10. Furthermore, the host IF 113 may provide interfacing with the data storage apparatus 10 in correspondence to a bus format of the host. The bus format of the host may include at least one of standard interface protocols such as a secure digital, a universal serial bus (USB), a multimedia card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral circuit interconnection (PCI), a PCI express (PCI-E), and a universal flash storage (UFS).

The ROM 1151 may store program codes required for the operation of the controller 110, for example, firmware or software, and store code data and the like used by the program codes.

The RAM 1153 may store data required for the operation of the controller 110 or data generated by the controller 110.

The memory IF 117 may provide a communication channel for signal transmission/reception between the controller 110 and the data storage device 120. The memory IF 117 may write data, which has been temporarily stored in the buffer memory 130, to the data storage device 120 under the control of the processor 111. Furthermore, the memory IF 117 may transfer data read from the data storage device 120 to the buffer memory 130 so that the read data is temporarily stored.

The read/write processing circuit 210 may control the ECC engine 220 in response to a read/write request of the host and transmit a read/write command to the data storage device 120.

The ECC engine 220 may update a chip-kill parity on a data slice basis with respect to user data to be written under the control of the read/write processing circuit 210, store the updated chip-kill parity in the parity storage 230, and encode the user data to be written on a data slice basis to generate an ECC parity. Furthermore, the ECC engine 220 may encode a final chip-kill parity to generate an ECC parity.

The ECC engine 220 may decode read data and the chip-kill parity in units of data slices under the control of the read/write processing circuit 210.

Although FIG. 2 illustrates that the ECC engine 220 generates both the chip-kill parity and the ECC parity, the scope of the disclosed technology is not limited thereto and a circuit for generating the chip-kill parity and a circuit for generating the ECC parity may be separately provided.

In an embodiment, while the chip-kill parity for the first data is being updated by the ECC engine 220, when a read request for the third data is received from the host, the read/write processing circuit 210 may read the third data from the parity die 123 and provide the third data to the host.

In an embodiment, the read/write processing circuit 210 may be configured not to transmit the second data to the parity die 123 while the chip-kill parity for the first data is being updated by the ECC engine 220, and to substantially maintain the second data in the buffer memory 130.

The parity storage 230 may be configured as a part of the RAM 1153 or the buffer memory 130, or a separate storage space inside or outside the controller 110.

As the chip-kill parity is cumulatively updated in units of data slices, when an error occurs during a read operation, a chip-kill operation is available which recovers data of a die or a plane, in which the error has occurred, by using data of another die or plane used for generating the chip-kill parity.

As the chip-kill parity is updated by the ECC engine 220 in units of data slices to be stored in each plane, the counter 240 may count the number of planes that have completed the update of the chip-kill parity, and transmit a plane count to the read/write processing circuit 210.

When the chip-kill parity for the first data to be stored in the data die 121 is being updated, that is, before the plane count reaches a set value, the read/write processing circuit 210 may not transmit the second data to the parity die 123 connected to substantially the same channel as the data die 121, thereby controlling user data already stored in the parity die 123, that is, the third data, to be read. In an embodiment, in order to confirm whether the update of the chip-kill parity for the first data has been completed, the read/write processing circuit 210 may confirm whether the plane count received from the counter 240 has reached a set value. In an embodiment, the set value may be determined as the number of planes included in the data die 121, that is, a product of the number A of data dies and the number B of planes for each die, but the present technology is not limited thereto.

As described above, in the present technology, while the chip-kill parity for the first data to be stored in the data die 121 is being updated, the controller 110 does not use or access for the write operation to the parity die 123 connected to substantially the same channel as the data die 121. Thus, when the host requests the third data to be read, the controller 110 can immediately respond to the read request of the host, resulting in the reduction of read latency.

Figure 3:
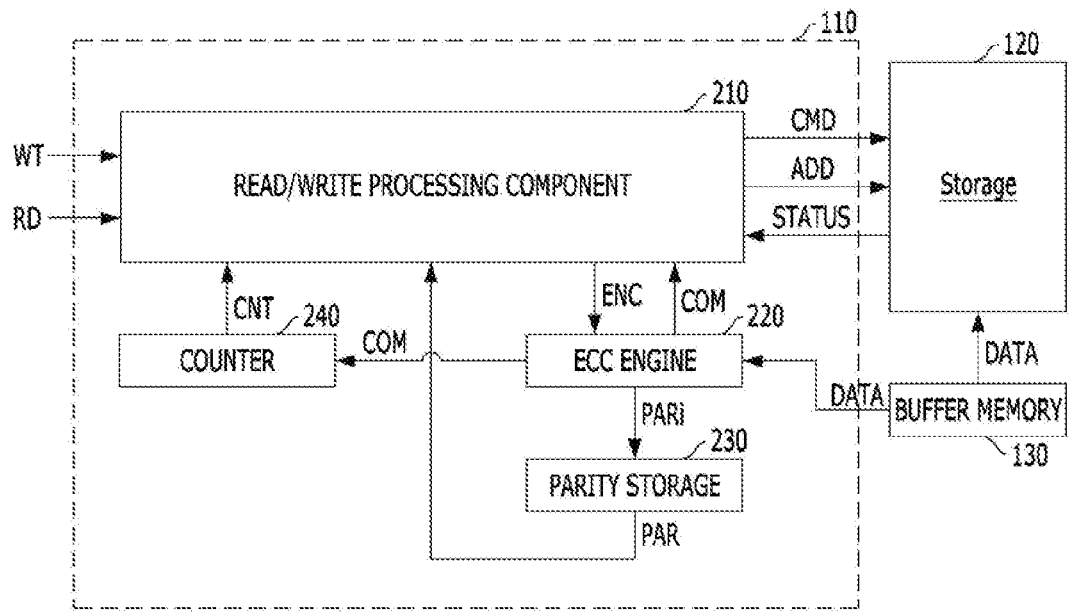
FIG. 3 is a conceptual diagram illustrating an operation of the controller based on some embodiments of the disclosed technology.

FIG. 3 is a conceptual diagram illustrating the operation of the controller 110 based on some embodiments of the disclosed technology.

The host may transmit a write request W to the controller 110. The write request WT may include first data including a plurality of data slices, second data including a plurality of data slices, and a logical address in which the first and second data are to be stored. The first and second data may be buffered in the buffer memory 130.

The read/write processing circuit 210 may extract a physical address ADD corresponding to the logical address included in the write request WT of the host, and transmit an encoding command ENC to the ECC engine 220.

It is assumed that a data die in which the first data is to be stored and a parity die in which the second data is to be stored are connected to substantially the same channel. The first data may include a plurality of unit data divided in units of planes and each unit data may include a plurality of data slices.

The ECC engine 220 may update a chip-kill parity PARi+1 in units of a plurality of data slices included in the first data. In an embodiment, the parity storage 230 may store an initial value of a chip-kill parity, and the ECC engine 220 may read a chip-kill parity PARi in a previous state from the parity storage 230 and store, in the parity storage 230, the chip-kill parity PARi+1 updated by performing an XOR operation with data slices sequentially provided.

The ECC engine 220 may generate an ECC parity for a data slice used for updating the chip-kill parity PARi+1.

Whenever the update of a chip-kill parity for unit data to be recorded on one plane is completed, the ECC engine 220 may transmit a chip-kill parity completion signal COM to the read/write processing circuit 210 and the counter 240.

Whenever the update of the unit chip-kill parity PARi is completed for each plane in which a plurality of unit data constituting the first data are to be written, that is, in response to the chip-kill parity completion signal COM for each plane of the first data, the read/write processing circuit 210 may write corresponding unit data and an ECC parity to the data die 121 of the data storage device 120. To this end, the read/write processing circuit 210 may transmit a program (write) command CMD and the physical address ADD, in which the first data is to be stored, to the data storage device 120, and transmit the first data stored in the buffer memory 130 to the data storage device 120 through the memory IF 117 (of FIG. 2). When the first data is completely programmed, the data storage device 120 may transmit, to the controller 110, a status signal STATUS indicating whether the first data has been successfully written.

In response to the chip-kill parity completion signal COM for unit data, that is, the chip-kill parity completion signal COM for each plane, the counter 240 may count the number of planes that have completed the update of the chip-kill parity, and transmit a plane count CNT to the read/write processing circuit 210.

During the processing of the write request WT, a read request RD may be received from the host. The read/write processing circuit 210 may control the read request RD, which is generated during the processing of the write request WT, based on the plane count CNT.

The read request RD may include a logical address, which is a storage position of data to be read, and the read/write processing circuit 210 may extract a physical address corresponding to the logical address included in the read request RD. When the extracted physical address is included in the data die 121 in which the write request is being processed, the read/write processing circuit 210 may hold the read request RD.

When the extracted physical address is included in the parity die 123 connected to substantially the same channel as the data die 121 in which the write request is being processed and the chip-kill parity of the first data is still being updated, the read/write processing circuit 210 may temporarily suspend the write operation for the data die 121, read the third data from the parity die 123, and provide the third data to the host.

The ECC engine 220 and the counter 240 may continue to operate until the chip-kill parity for all write-requested data, that is, the first data and the second data, is updated, and when the generation of a final chip-kill parity PAR for data to be written is completed, the ECC engine 220 may generate an ECC parity for the final chip-kill parity PAR. In addition, the read/write processing circuit 210 may request the final chip-kill parity PAR and the ECC parity for the final chip-kill parity PAR to be written to the data storage device 120.

Figure 4:
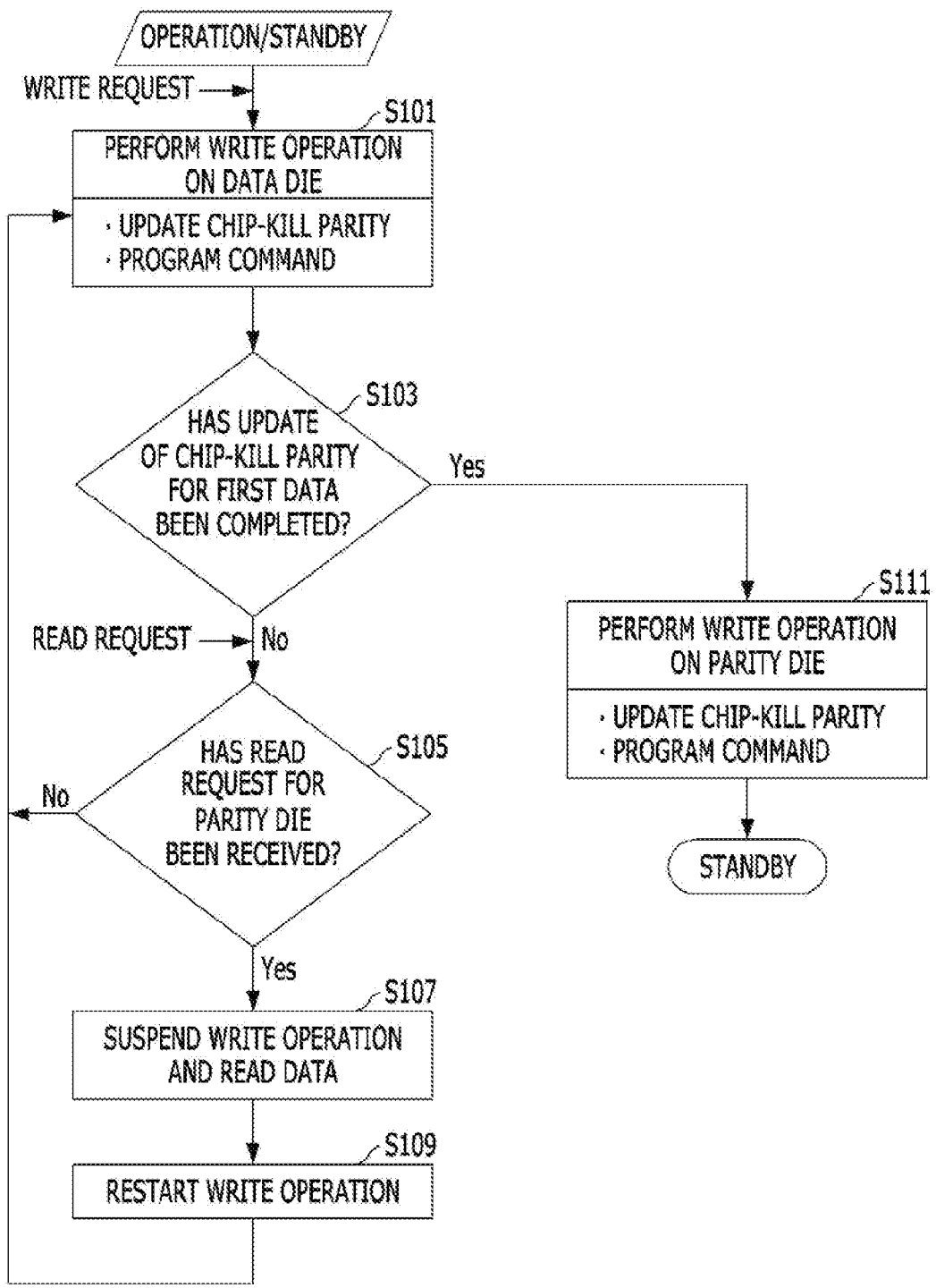
FIG. 4 is a flowchart for explaining an operation method of the data storage apparatus based on some embodiments of the disclosed technology.

FIG. 4 is a flowchart for explaining an operation method of the data storage apparatus 10 based on some embodiments of the disclosed technology.

During the operation or standby of the data storage apparatus 10, the write request WT comprising user data including the first data and the second data and a logical address may be received from the host.

The controller 110 may write the first data to the data die 121 according to a result obtained by parsing the write request WT (S101). In an embodiment, in order to write the first data, the controller 110 may update a chip-kill parity in units of data slices of unit data constituting the first data, generate an ECC parity for unit data for which the update of the chip-kill parity has been completed, and write the ECC parity to the data storage device 120.

Whenever the update of the chip-kill parity is completed for each unit data, the controller 110 may count the number of planes that have completed the update of the chip-kill parity, and confirm whether the update of the chip-kill parity for the first data has been completed, based on a plane count (S103) indicating the number of planes that have completed the chip-kill parity update.

In an embodiment, the controller 110 may confirm whether the number of planes, in which the update has been completed, has reached a set value. In an embodiment, the set value may be determined as the number of planes included in the data die 121, that is, a product of the number A of data dies and the number B of planes for each die, but the present technology is not limited thereto.

When the update of the chip-kill parity for the first data has been completed (S103: Y), the controller 110 may update the chip-kill parity based on the second data and write the second data and a final chip-kill parity PAR to the parity die 123 (S111).

In an embodiment, in order to write the second data and the final chip-kill parity PAR to the parity die 123, the controller 110 may update the chip-kill parity for each data slice of unit data constituting the second data, and generate an ECC parity. When the update of the chip-kill parity is completed, the controller 110 may generate an ECC parity for the final chip-kill parity, and write the second data, the final chip-kill parity, and the ECC parity for the final chip-kill parity to the parity die of the data storage device 120.

When a read request RD is received from the host before the update of the chip-kill parity for the first data to be stored in the data die 121 is completed (S103: N), the controller 110 may confirm whether a physical address extracted on the basis of a logical address included in the read request RD is included in the parity die (S105).

When the read request RD is not a read request for the parity die 123, but a read request for the data die (S105: N), the controller 110 may hold the read request RD and continuously perform the write operation on the data die (S101).

However, when the read request RD is the read request for the parity die 123, (S105: Y), the controller 110 may temporarily suspend the write operation, read the third data from the parity die 123, and provide the third data to the host (S107).

Then, after restarting the write operation (S109), the controller 110 may continuously perform the write operation on the data die (S101).

Accordingly, while the chip-kill parity for the first data to be stored in the data die 121 is being updated, the controller 110 may control user data stored in the parity die 123, that is, the third data, to be read.

Figure 5:
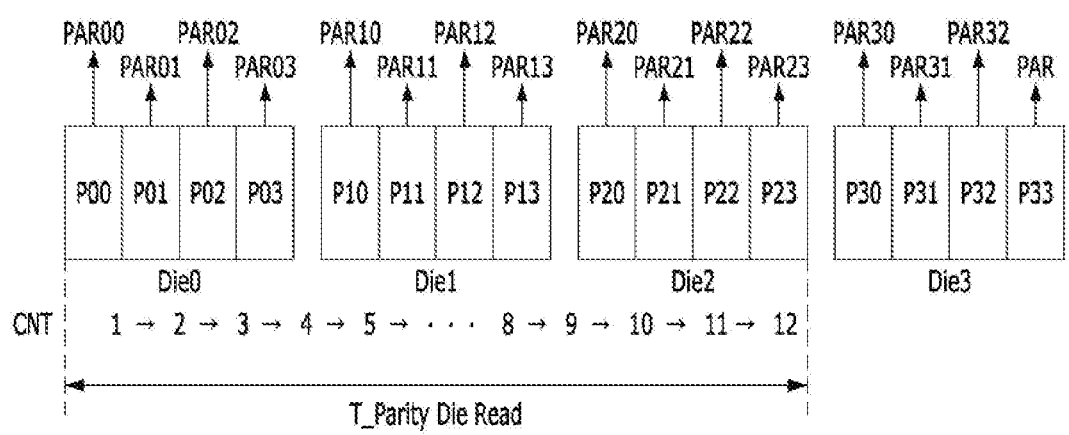
FIG. 5 is a diagram for explaining the concept of reducing read latency based on some embodiments of the disclosed technology.

FIG. 5 is a diagram for explaining the concept of reducing read latency based on some embodiments of the disclosed technology.

Referring to FIG. 5, whenever chip-kill parity completion signals COM_PAR00 to COM_PAR03, COM_PAR10 to COM_PAR13, and COM_PAR20 to COM_PAR23 for each plane are generated in units of planes P00 to P03, P10 to P13, and P20 to P23 of data dies Die0 to Die2, the plane count CNT of the counter 240 may increase.

Until the plane count CNT reaches a set value 12 determined as the number of planes included in the data dies Die0 to Die2, that is, 12 which is a product of 3 and 4 that are the number of data dies and the number of planes for each die, respectively (T_Parity Die Read), the controller 110 may provide a read service for a parity die Die3.

After the first data is completely written to the data dies Die0 to Die2, the controller 110 may update a chip-kill parity for each data slice with respect to the second data to be stored in the parity die Die3, and generate chip-kill parity completion signals COM_PAR30 to COM_PAR32 for each plane in units of planes. Accordingly, a generated final chip-kill parity PAR may be stored in the parity die 123.

As a consequence, it is not necessary to hold a read request for the parity die until the first and second data and the chip-kill parity generated therefrom is completely written, so that it is possible to shorten read latency.

Figure 6:
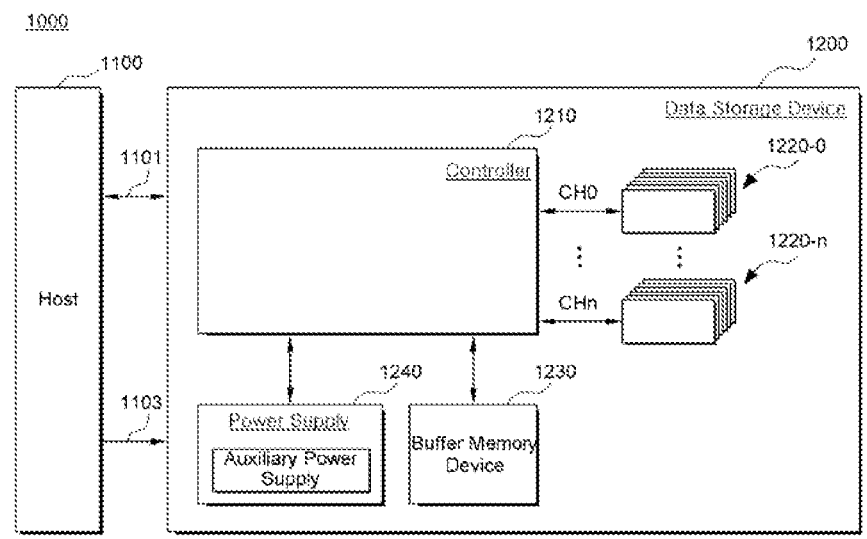
FIG. 6 is a diagram illustrating a data storage system based on some embodiments of the disclosed technology.

FIG. 6 is a diagram illustrating a data storage system 1000, based on some embodiments of the disclosed technology.

Referring to FIG. 6, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface unit, a control unit, a random access memory used as a working memory, an error correction code (ECC) unit, and a memory interface unit. In an embodiment, the controller 1210 may configured as controller 110 shown in FIGS. 1 and 2.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be normally terminated when a sudden power interruption occurs. The auxiliary power supply may include bulk-capacity capacitors sufficient to store the needed charge.

The signal connector 1101 may be configured as one or more of various types of connectors depending on an interface scheme between the host device 1100 and the data storage device 1200.

The power connector 1103 may be configured as one or more of various types of connectors depending on a power supply scheme of the host device 1100.

Figure 7:
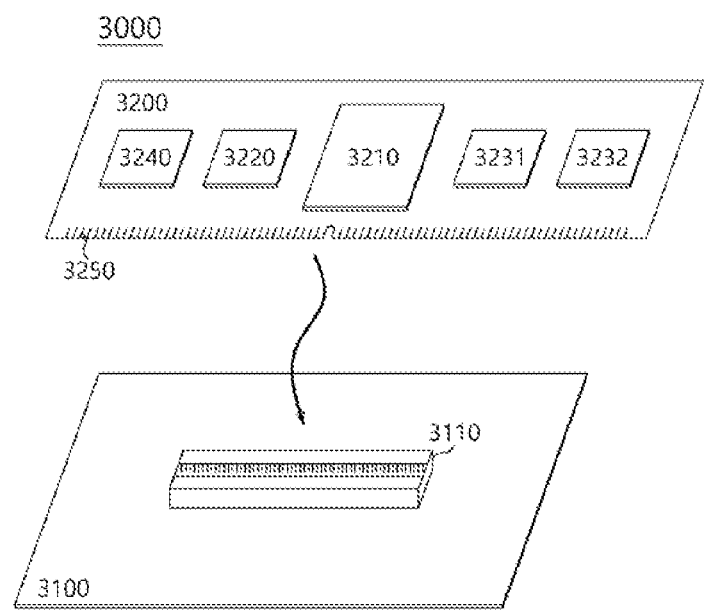
FIG. 7 and FIG. 8 are diagrams illustrating a data processing system based on some embodiments of the disclosed technology.

FIG. 7 is a diagram illustrating a data processing system 3000, based on some embodiments of the disclosed technology. Referring to FIG. 7, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200. The connection terminal 3250 may be configured as one or more of various types depending on an interface scheme between the host device 3100 and the memory system 3200. The connection terminal 3250 may be disposed on a side of the memory system 3200, as shown.

Figure 8:
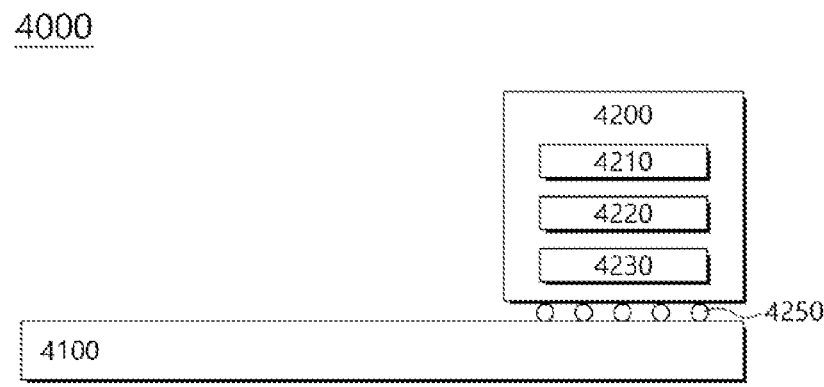

FIG. 8 is a diagram illustrating a data processing system 4000 based on some embodiments of the disclosed technology. Referring to FIG. 8, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 shown in FIGS. 1 and 2.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the data storage device medium of the memory system 4200.

Figure 9:
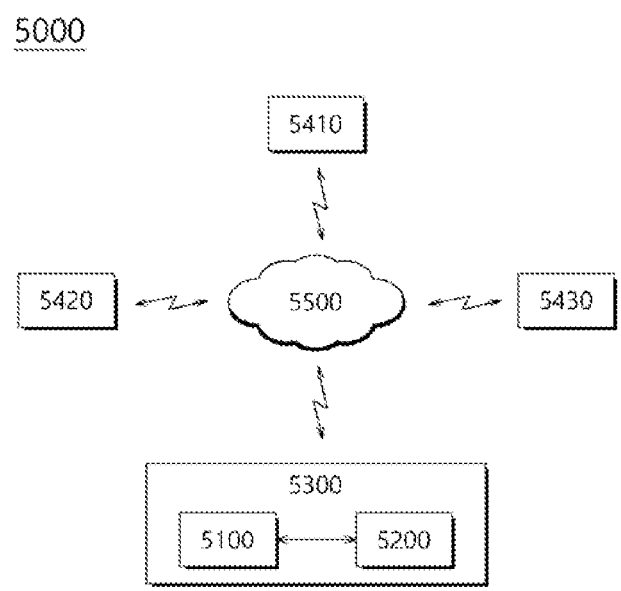
FIG. 9 is a diagram illustrating a network system including a data storage device based on some embodiments of the disclosed technology.

FIG. 9 is a diagram illustrating a network system 5000 including a data storage device, based on some embodiments of the disclosed technology. Referring to FIG. 9, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the memory system 10 shown in FIG. 1, the data storage device 1200 shown in FIG. 6, the memory system 3200 shown in FIG. 7, or the memory system 4200 shown in FIG. 8.

Figure 10:
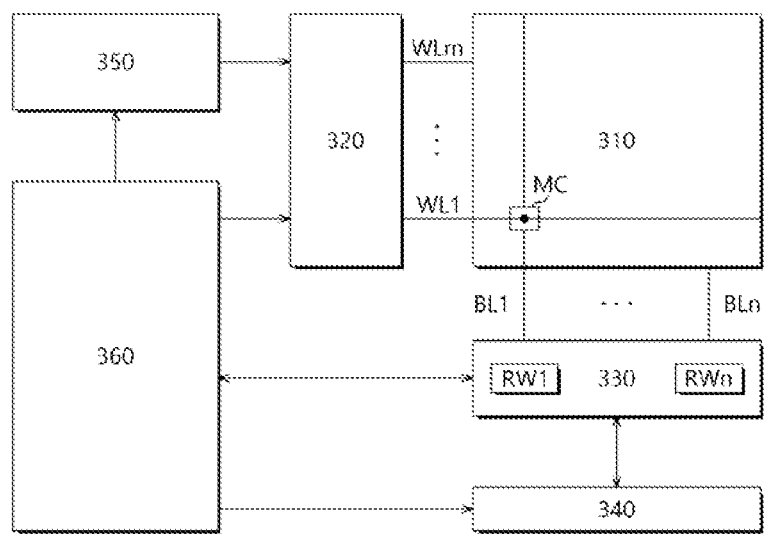
FIG. 10 is a block diagram illustrating a nonvolatile memory device included in a data storage device based on some embodiments of the disclosed technology.

FIG. 10 is a block diagram illustrating a nonvolatile memory device 300 included in a data storage device, such as the data storage device 10, based on some embodiments of the disclosed technology. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure by perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed (i.e., the memory cells to which data is to be written). For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided by the external device. For example, the control logic 360 may control operations of the nonvolatile memory device 300 such as read, write, and erase operations of the nonvolatile memory device 300.

Only limited examples of implementations or embodiments of the disclosed technology are described or illustrated. Variations and enhancements for the disclosed implementations or embodiments and other implementations or embodiments are possible based on what is disclosed and illustrated in this patent document.

What is claimed is:

1. A data storage apparatus comprising:
a data storage device including at least one data die to store first data, and at least one parity die to store second data, third data, and a chip-kill parity, where the at least one data die and the at least one parity die are connected to a channel; and
a controller in communication with the data storage device and configured to receive a write request for the first data and the second data from a host that is in communication with the data storage device through the channel to generate the chip-kill parity from the first data and the second data, wherein the controller is further configured to read the third data from the parity die and provide the third data to the host upon receipt of a read request for the third data from the host while the chip-kill parity is being updated based on the first data.

2. The data storage apparatus according to claim 1, wherein the data die and the parity des are composed of a plurality of planes, and the controller comprises:
a read and write processing circuit configured to transmit a program command or a read command to the data storage device, and control operation associated with the read request received from the host while the chip-kill parity for the first data is being updated;
an error check and correction (ECC) circuit configured to generate a chip-kill parity based on the first data and the second data in response to a control signal from the read and write processing circuit, and output an encoding completion signal upon each completion of a chip-kill parity update for each plane; and a counter configured to count a number of planes that have completed the chip-kill parity update, in response to the encoding completion signal, and transmit a plane count indicating the number of planes that have completed the chip-kill parity update to the read and write processing circuit.

3. The data storage apparatus according to claim 2, wherein the read and write processing circuit is configured to control operations associated with the read request based on a comparison between the plane count and a set value.

4. The data storage apparatus according to claim 3, wherein the set value is determined based on the number of planes included in the at least one data die.

5. The data storage apparatus according to claim 3, wherein, upon receipt of the read request for the third data from the host before the plane count reaches the set value, the read and write processing circuit is configured to temporarily suspend processing of the write request and process the read request.

6. The data storage apparatus according to claim 3, wherein, upon receipt of a read access request for the data die from the host before the plane count reaches the set value, the read and write processing circuit is configured to hold off the read request.

7. A data storage apparatus comprising:
a data storage device including at least one data die and at least one parity die, the at least one data die storing first data including a plurality of planes, the at least one parity die storing second data, third data, and a chip-kill parity and including a plurality of planes, the at least one data die and the at least one parity die being connected to a channel; and
a controller in communication with the data storage device and configured to receive a write request for the first data and the second data from a host that is in communication with data storage device through the channel to generate the chip-kill parity from the first data and the second data, wherein the controller is further configured to maintain the second data outside the data storage device until an update of the chip-kill parity based on the first data is completed.

8. The data storage apparatus according to claim 7, wherein the controller is configured to transmit a program command or a read command to the data storage device, and control operations associated with a read request received from the host while the chip-kill parity is being updated based on the first data.

9. The data storage apparatus according to claim 8, wherein the controller is configured to count the number of planes that have completed the chip-kill parity update to generate a plane count upon each completion of a chip-kill parity update for each plane based on the first data, and control operations associated with the read request based on a comparison result of the plane count and a set value.

10. The data storage apparatus according to claim 9, wherein the set value is determined based on the number of planes included in the at least one data die.

11. The data storage apparatus according to claim 9, wherein, when the read request for the third data is received from the host before the plane count reaches the set value, the controller is configured to temporarily suspend processing of the write request and process the read request.

12. The data storage apparatus according to claim 9, wherein, when a read access request for the data die is received from the host before the plane count reaches the set value, the controller is configured to hold off the read request.

13. An operation method of a data storage apparatus including a data storage device including at least one data die and at least one parity die and a controller that exchanges data with the data storage device, the at least one data die storing first data and including a plurality of planes, the at least one parity die storing second data, third data, and a chip-kill parity and including a plurality of planes, the at least one data die and the at least one parity die being connected to a channel, the operation method comprising:
updating the chip-kill parity based on the first data upon receipt of a write request for the first data and the second data from a host through the channel;
receiving a read request from the host while the chip-kill parity is being updated; and
reading the third data from the parity die to provide the third data to the host in case that the read request is a read request for the third data.

14. The operation method according to claim 13, further comprising:
updating the chip-kill parity based on the first data and the second data upon receipt of the write request;
outputting an encoding completion signal upon each completion of the update of the chip-kill parity for each plane; and
counting the number of planes that have completed the chip-kill parity update, in response to the encoding completion signal to output a plane count indicating the number of planes that have completed the chip-kill parity update.

15. The operation method according to claim 14, further comprising:
controlling operations associated with the read request based on a comparison between the plane count and a set value.

16. The operation method according to claim 15, wherein the set value is determined based on the number of planes included in the at least one data die.

17. The operation method according to claim 15, further comprising:
upon receipt of the read request for the third data from the host before the plane count reaches the set value, temporarily suspending processing of the write request to process the read request.

18. The operation method according to claim 15, further comprising:
upon receipt of a read access request for the data die from the host before the plane count reaches the set value, holding off the read request.

* * * * *